US006907587B2

(12) United States Patent
Rittman et al.

(10) Patent No.: US 6,907,587 B2
(45) Date of Patent: Jun. 14, 2005

(54) SYSTEM AND METHOD FOR CORRECTING CONNECTIVITY ERRORS IN A MASK LAYOUT FILE

(75) Inventors: Dan Rittman, San Mateo, CA (US); Micha Oren, Cupertino, CA (US)

(73) Assignee: DuPont Photomasks, Inc., Round Rock, TX (US)

( * ) Notice: Subject to any disclaimer, the term of this patent is extended or adjusted under 35 U.S.C. 154(b) by 302 days.

(21) Appl. No.: 10/132,776

(22) Filed: Apr. 25, 2002

(65) Prior Publication Data

US 2002/0166108 A1 Nov. 7, 2002

Related U.S. Application Data

(63) Continuation-in-part of application No. 09/414,155, filed on Oct. 8, 1999, now abandoned.

(51) Int. Cl.[7] .......................... G06F 9/45; G06F 9/455; G06F 17/50

(52) U.S. Cl. ................................ 716/5; 716/4; 716/11; 716/19

(58) Field of Search ............................ 716/1–5, 10–14, 716/19–21

(56) References Cited

U.S. PATENT DOCUMENTS

| | | | | | |
|---|---|---|---|---|---|
| 5,249,133 | A | | 9/1993 | Batra | 364/489 |
| 5,463,561 | A | * | 10/1995 | Razdan | 716/5 |
| 5,612,893 | A | | 3/1997 | Hao et al. | 364/491 |
| 5,640,497 | A | | 6/1997 | Woolbright | 395/133 |
| 5,663,893 | A | | 9/1997 | Wampler et al. | 364/491 |
| 5,689,433 | A | | 11/1997 | Edwards | 364/490 |
| 5,712,794 | A | | 1/1998 | Hong | 364/491 |
| 5,740,071 | A | | 4/1998 | Leipold | 364/490 |
| 5,745,374 | A | | 4/1998 | Matsumoto | 364/491 |
| 5,764,530 | A | | 6/1998 | Yokomaku | 364/490 |
| 5,764,533 | A | | 6/1998 | deDood | 364/491 |
| 5,787,006 | A | | 7/1998 | Chevallier et al. | 364/488 |
| 5,815,402 | A | | 9/1998 | Taylor et al. | 364/488 |
| 5,828,580 | A | | 10/1998 | Ho | 364/489 |
| 5,901,066 | A | | 5/1999 | Hong | 364/491 |
| 5,905,669 | A | * | 5/1999 | Horita | 365/51 |
| 6,009,251 | A | | 12/1999 | Ho et al. | 395/500.06 |
| 6,009,252 | A | * | 12/1999 | Lipton | 716/5 |
| 6,128,768 | A | | 10/2000 | Ho | 716/5 |
| 6,189,132 | B1 | | 2/2001 | Heng et al. | 716/11 |
| 6,230,299 | B1 | | 5/2001 | McSherry et al. | 716/1 |
| 6,260,177 | B1 | | 7/2001 | Lee et al. | 716/2 |
| 6,289,412 | B1 | | 9/2001 | Yuan et al. | 711/11 |
| 6,711,534 | B1 | * | 3/2004 | Parashkevov | 703/15 |

FOREIGN PATENT DOCUMENTS

| | | | |
|---|---|---|---|
| JP | 401059830 A | 3/1989 | |
| JP | 409288686 A | 11/1997 | G06F/17/50 |

OTHER PUBLICATIONS

"Scan Line Algorithm for Layout Compactor of Integrated Circuits", IBM Technical Disclosure Bulletin, Jan. 2, 1989 vol. 31 Issue 8 Page Nos. 248–251.

"Systematic Formulation of Design Rules for Integrated Circuit Layouts", IBM Technical Disclosure Bulletin, Dec. 1, 1987 vol. 30 Issue 7 Page Nos. 120–123.

Hsiao et al. "A rule–based compactor for VLSI/CAD mask layout", Computer Software and Applicaitons Conference, Oct. 5–7, 1988 COMPSAC 88. Proceedings, Twelfth International pp. 35–42.

(Continued)

*Primary Examiner*—Leigh M. Garbowski
(74) *Attorney, Agent, or Firm*—Baker Botts L.L.P.

(57) ABSTRACT

A system and method for correcting connectivity errors in a mask layout are disclosed. The method includes comparing a first connection in a mask layout file to a second connection in a schematic netlist. A connectivity error is identified if the first connection does not match the second connection and the identified connectivity error is automatically corrected in the mask layout file.

22 Claims, 6 Drawing Sheets

OTHER PUBLICATIONS

Hsiao et al. "Using a multiple storage quad tree on a hierarchical VLSI compaction scheme", IEEE Transactions onComputer–Aided Design vol. 9 No. 5 pp. 522–536, May 1990.

Hambrusch et al. "A Framework for 1–D Compaction with Forbidden Region Avoidance", VLSI, Mar. 1–2, 1991 Proceedings, First Great Lakes Symposium pp. 146–151.

Hsiao et al. "Expert compactor: a knowledge–based application in VLSI layout compaction", Computers and Digital Techniques, IEEE Proceedings–E, vol. 138, No. 1, pp. 13–26, Jan. 1991.

Feng et al. "Computer–aided design on the VLSI 45/spl deg/–mask compaction", Computer, Communication, Control and Power Engineering Proceedings, TENCON '93, Oct. 19–21, 1993 IEEE Region 10 Conference pp. 750–753.

Apanovich et al. "DECOMP: a technology migration subsystem for full hcip mask layouts", Communications, Computers and Signal Processing, Aug. 20–22, 1997 IEEE Pacific Rim Conference pp. 942–945.

Wonjong Kim et al. "Hierarchical LVS Based on Hierarchy Rebuilding", Proceedings of the ASP–DAC Feb. 10, 1998, Asia and South Pacific Design Automation Conference, pp. 379–384.

Shiran "YNCC/sub DB/: A New Database Representation of VLSI Circuits for Fast Navigation and Layout Verification Applications", IEEE Comput. Soc. Press. CompuEuro 88–System Design: Concepts, Methods and Tools. pp 150–155, Apr. 1988.

Hojati et al. "Transformation–based layout optimization", Proceedings of the IEEE May 13, 1990 Custom Integrated Circuits Conference, pp 30.5/1–30.5/4.

"Automatic Jog Algorithm for Layout Compactor", IBM Technical Disclosure Bulletin, Jun. 1, 1992, vol. 35 Issue 1A pp. 425–432.

* cited by examiner

SYSTEM AND METHOD FOR CORRECTING CONNECTIVITY ERRORS IN A MASK LAYOUT FILE

RELATED APPLICATIONS

This application is a continuation-in-part of U.S. patent application Ser. No. 09/414,155, filed Oct. 8, 1999 now abandoned and entitled "AUTOMATIC FIX (CORRECTION) OF ACTIVITY MISMATCHES (LVS: IC LAYOUT VERSUS IC SCHEMATICS) THROUGHOUT GLOBAL MASK LAYOUT DATABASE (IC LAYOUT) COMPUTER SOFTWARE."

TECHNICAL FIELD OF THE INVENTION

This invention relates in general to the field of integrated circuit design, and more particularly to a method for correcting connectivity errors in a mask layout file.

BACKGROUND OF THE INVENTION

Over the past several years, the number of transistors in semiconductor devices has increased dramatically. Due to this increase, the time to design and manufacture semiconductor devices has also increased.

A typical semiconductor design process includes numerous steps. Initially, a schematic diagram that represents an integrated circuit is prepared. The schematic diagram provides a representation of the logical connections between logic elements that form the integrated circuit. Once the schematic diagram has been tested to verify that the circuit performs the correct functions, the schematic diagram is converted into a mask layout database that includes a series of polygons. The polygons may represent the logic elements and the logical connections from the schematic diagram. The mask layout database is then used to form a series of photomasks, also know as masks or reticles, that may be used to manufacture the different layers of the integrated circuit.

Typically, the mask layout database is created manually by a mask designer or automatically by a synthesis tool. Once the mask layout database is complete, polygons that form electrical connections in the mask layout database are compared to the logical connections from the schematic diagram. This comparison may result in connection mismatches between the schematic diagram and the mask layout database. A connection mismatch typically indicates that an electrical connection in the mask layout database does not match its corresponding logical connection in the schematic diagram.

Today, any mismatches are corrected manually by a layout designer. The layout designer first must find the correct connection and then determine how to create the correct electrical connection in the mask layout database. Typically, the layout designer is required to delete the mismatched connection in the mask layout database and locate a path through existing polygons in the mask layout database. Once an appropriate path through the mask layout database is found, the layout designer creates a new electrical connection in the mask layout database that matches the corresponding logical connection in the schematic diagram. This process of adding the new electrical connection may take several hours or days to complete. Furthermore, the layout designer may introduce design rule errors in the mask layout database when adding the new connection. Eliminating the design rule errors may additionally require several more hours or days and thus, increase the design time for the integrated circuit.

SUMMARY OF THE INVENTION

In accordance with the present invention, the disadvantages and problems associated with correcting connectivity errors in a mask layout file have been substantially reduced or eliminated. In a particular embodiment, an automated method for correcting connectivity errors in a mask layout database includes identifying a connectivity error in the mask layout file and automatically correcting the connectivity error in the mask layout file.

In accordance with one embodiment of the present invention, an automated method for correcting connectivity errors in a mask layout file includes comparing a first connection in the mask layout file to a second connection in a schematic netlist. A connectivity error is identified if the first connection does not match the second connection and the connectivity is automatically corrected in the mask layout file.

In accordance with another embodiment of the present invention, a computer system for correcting connectivity errors in a mask layout file includes a processing resource coupled to a computer readable memory. Processing instructions are encoded in the computer readable memory. The instructions are executed by the processing resource to compare a first connection in a mask layout file to a second connection in a schematic netlist. The instructions further identify a connectivity error in the mask layout file if the first connection does not match the second connection and automatically correct the connectivity error in the mask layout file.

Important technical advantages of certain embodiments of the present invention include a layout versus schematic (LVS) tool that reduces the design time for an integrated circuit. The LVS tool checks a mask layout file for connectivity errors and identifies any errors in an output file. If connectivity errors are identified, the LVS tool automatically removes any mismatched connections and replaces the mismatched connections with electrical connections that match the corresponding logical connections in a schematic diagram. By integrating the ability to check for connectivity Thy errors with the ability to correct the connectivity errors, the time needed for the verification process for the mask layout file is substantially reduced.

Another important technical advantage of certain embodiments of the present invention includes an LVS tool that adds electrical connections to a mask layout file without introducing design rule errors. The LVS tool locates a path in the mask layout file to add an electrical connection that matches the corresponding logical connection from a schematic diagram. When routing the electrical connection, the LVS tool uses design rules from a technology file for a specific manufacturing process and routes the electrical connection to avoid creating any design rule errors. The need for another design rule error check is therefore eliminated.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the invention and its advantages are best understood by reference to FIGS. 1 through 5 of the drawings, like numerals being used for like and corresponding parts of the various drawings.

Figure 1:
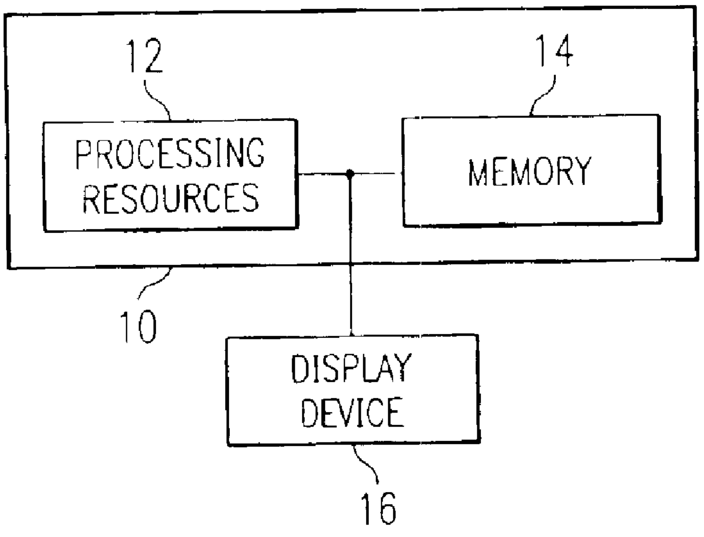
FIG. 1 illustrates a block diagram of a computer system for correcting connectivity errors in a mask layout file in accordance with the teachings of the present invention.

FIG. 1 illustrates a block diagram of computer system 10 that may be used to correct connectivity errors in a mask layout file. In the illustrated embodiment, computer system 10 includes processing resource 12, memory 14 and display device 16. Processing resource 12 may be a microprocessor, a microcontroller, a digital signal processor (DSP) or any other digital or analog circuitry configured to execute processing instructions stored in memory 14. Memory 14 may be random access memory (RAM), electrically erasable programmable read-only memory (EEPROM), a PCMCIA card, flash memory, or any suitable selection and/or array of volatile or nonvolatile memory that retains data after the power to computer system 10 is turned off. Display device 16 may be a liquid crystal device, cathode ray tube, or other display device suitable for creating graphic images and alphanumeric characters recognizable to a user.

In operation, processing instructions are stored in memory 14. Processing resource 12 accesses memory 14 to retrieve the processing instructions and perform various functions included in the processing instructions. In one embodiment, the processing instructions may include a layout-versus-schematic (LVS) tool. The LVS tool may compare logical connections contained in a netlist generated from a schematic diagram of an integrated circuit with electrical connections contained in a mask layout file generated from the corresponding layout block for the integrated circuit. If the electrical connections in the mask layout file match the logical connections in the netlist, the LVS tool may generate an output file that indicates the mask layout file does not include any connectivity errors.

However, if at least one electrical connection in the mask layout file does not match the corresponding logical connection in the netlist, the LVS tool may generate an output file that contains any connectivity errors identified by the LVS tool in the mask layout file. This output file is then used to locate the electrical connections in mask layout file that do not match the corresponding logical connections in the netlist. The LVS tool automatically deletes the mismatched connections. In one embodiment, the LVS tool removes all of the polygons associated with the mismatched connection. In another embodiment, the LVS tool creates a break point in the mismatched connections and removes the polygons between the break point to the mismatched node.

In one embodiment, the LVS tool may use the output file to locate nodes in the mask layout file that correspond to the nodes in the netlist. The LVS tool may match the nodes in the mask layout file to the nodes in the netlist and generate electrical connections that match the logical connections. The LVS tool then automatically routes the electrical connections between the appropriate nodes. The electrical connections are routed though the mask layout file without creating any design rule errors in the mask layout file. The process is performed on all mismatched connections until all the connectivity errors are removed from the mask layout file.

In other embodiments, the processing instructions for correcting connectivity errors in a mask layout file may be encoded in computer-usable media. Such computer-usable media may include, without limitation, storage media such as floppy disks, hard disks, CD-ROMs, DVDs, read-only memory, and random access memory; as well as communications media such wires, optical fibers, microwaves, radio waves, and other electromagnetic or optical carriers.

Figure 2:
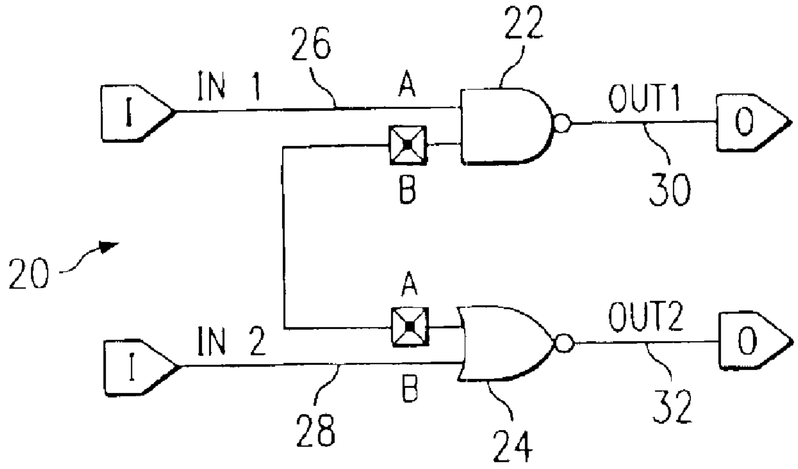
FIG. 2 illustrates a schematic diagram of an example integrated circuit in accordance with the teachings of the present invention.

FIG. 2 illustrates schematic diagram 20 of an integrated circuit that includes NAND 22 and NOR 24. NAND 22 may include two inputs, labeled a and b and NOR 24 may include two inputs, labeled a and b. In the illustrated embodiment, node 26, labeled in1, is connected to input a of NAND 22, node 28, labeled in2, is connected to input b of NOR 24, and input b of NAND 22 is connected to input a of NOR 24. Output 30 of NAND 22 is labeled out1 and output 32 of NOR 34 is labeled out2. In an alternative embodiment, NAND 22 and NOR 24 may have more than two inputs and the circuit may be connected in any suitable way. In other embodiments, the integrated circuit may include other logical elements, including, but not limited to, inverters, AND gates, OR gates, XOR gates and XNOR gates, and complex circuits, such as adders, latches, flip-flops, multiplexers, registers and any other type of circuitry that may be used to form an integrated circuit.

In order to verify that the logic elements and associated connections perform the desired function, a netlist of the integrated circuit in schematic diagram 20 may be generated. The netlist may include a list of transistors, such as P-MOSFETS and N-MOSFETS that form the integrated circuit, nodes associated with the integrated circuit (e.g., nodes 26 and 28 and outputs 30 and 32) and the logical connections between the nodes. A verification tool may be used to verify the connections and the verified netlist may be stored in memory 14 for use by other applications.

Figure 3:
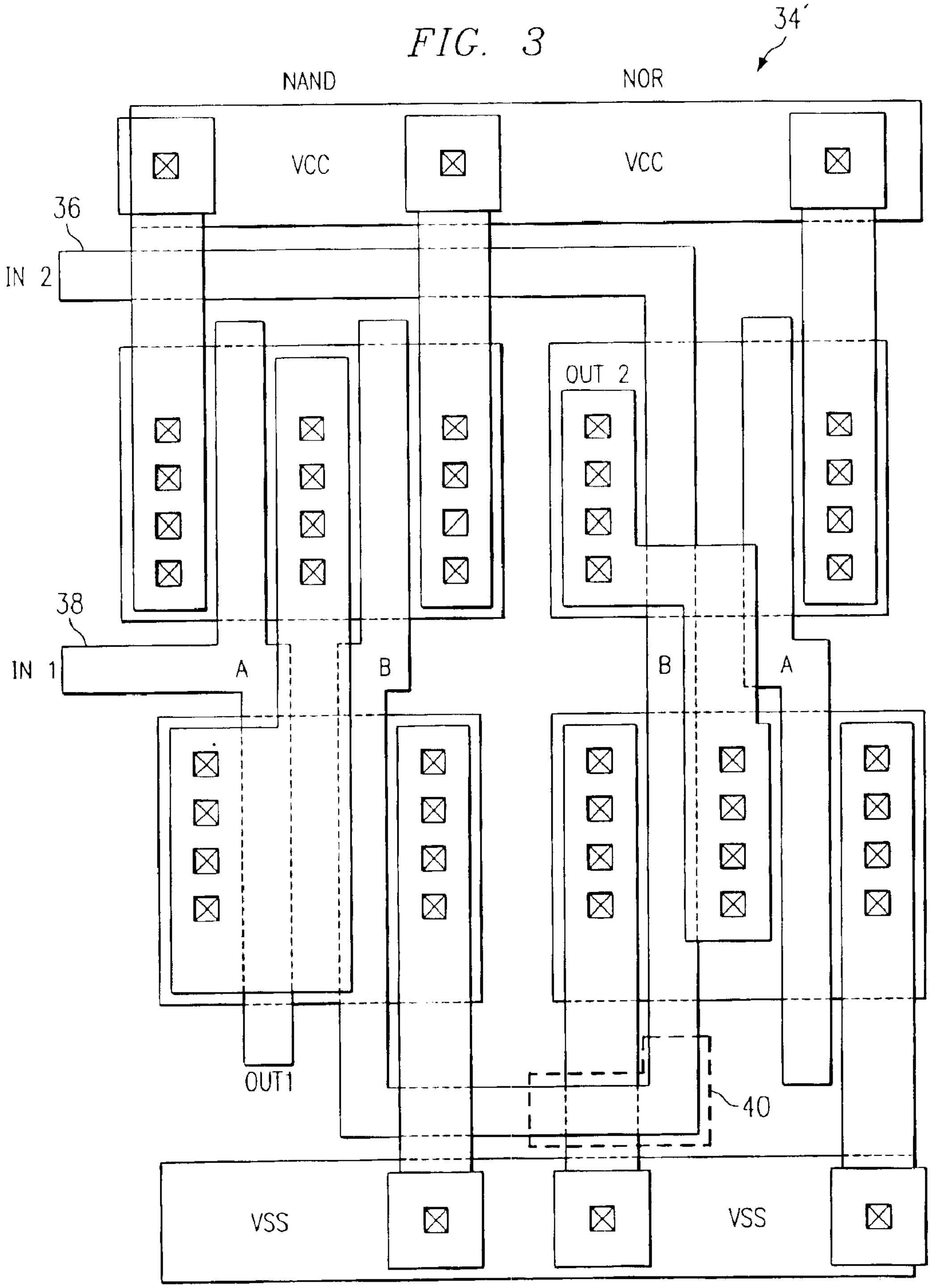
FIG. 3 illustrates a layout view of the example integrated circuit in the schematic diagram of FIG. 2 after verification by a layout-versus-schematic (LVS) tool.

FIG. 3 illustrates layout block 34 that represents the integrated circuit shown in schematic diagram 20 of FIG. 2. Layout block 34 includes polygons that form NAND 22 and NOR 24. Node 36 corresponds to node 26 in schematic diagram 26 and node 38 corresponds to node 28 in schematic diagram 20. As shown, the polygons have been drawn such that node 36 is connected to input a of NAND 22, node 38 is connected to input b of NOR 24 and input b of NAND 22 is connected to input b of NOR 24.

A mask layout file may be generated from layout block 34 and checked for connectivity errors by an LVS tool. The LVS tool compares electrical connections in the mask layout file with logical connections in the netlist generated from schematic diagram 20. The LVS tool may generate an output file indicating that layout block 34 is either free of connectivity errors or has connectivity errors. The output file may be used by a computer aided design (CAD) tool executing on computer system 10 to display the location of any errors within layout block 34 to a user on display device 16. As illustrated in FIG. 3, connectivity error 40 in layout block 34 was identified by the LVS tool since, according to schematic diagram 20, input b of NAND 22 should be connected to input a of NOR 24. Connectivity error 40 may be shown in layout block 34 by highlighting, circling or identifying the connectivity error with any other suitable method. The identification method may include identifying all or a portion of the mismatched electrical connection.

Figure 4A:
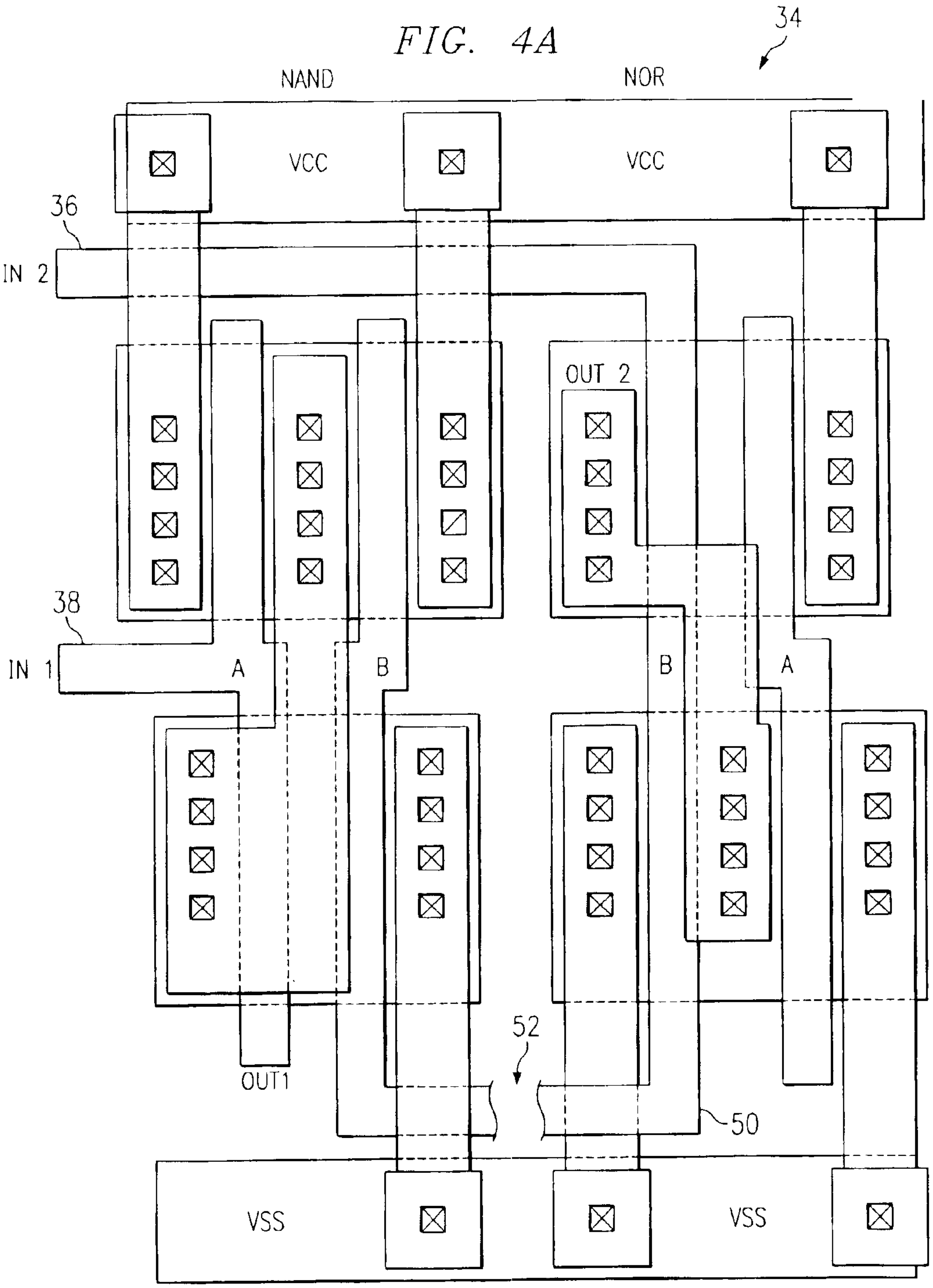
FIGS. 4A–4C illustrate layout views of the example integrated circuit in the schematic diagram of FIG. 2 at various stages of correcting connectivity errors in a mask layout file.
Figure 4B:
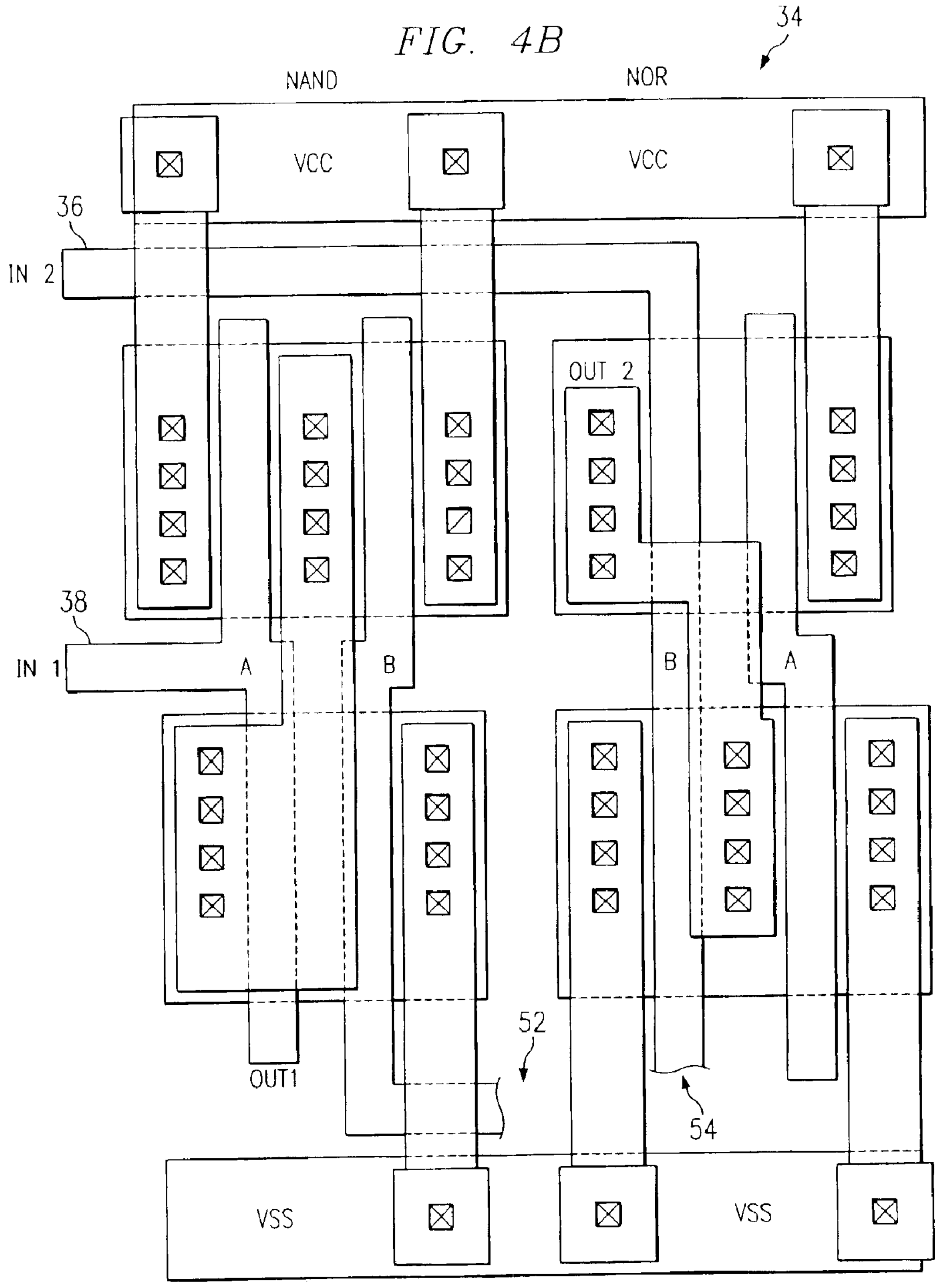
Figure 4C:
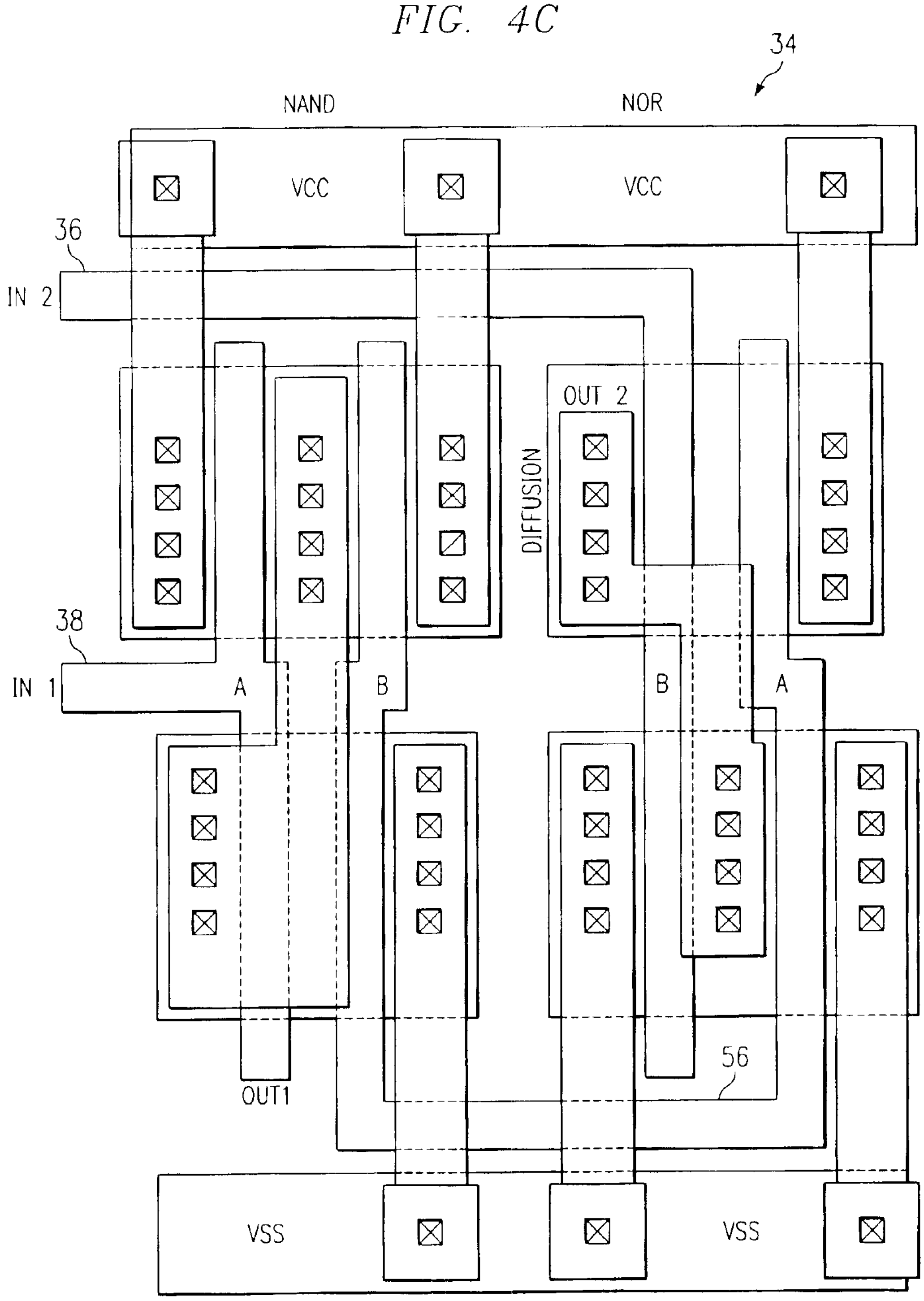

FIGS. 4A through 4C illustrate layout block 34 at various steps performed by an LVS tool to correct connectivity errors in a mask layout file. After identifying any connectivity errors in the mask layout file, the LVS tool begins the process of removing mismatched connections and replacing them with matching electrical connections. As illustrated in FIG. 4A, the LVS tool may create break point 52 in mismatched connection 50. Break point 52 isolates input b of NAND 22 from input b of NOR 24. The LVS tool then removes the polygons located between break point 52 and the mismatched node to create open space 54(e.g., input b of NOR 24), as illustrated in FIG. 4B. The LVS locates the correct node (e.g., input a of NOR 24) and adds polygons from break point 52 to input a of NOR 24 to form matching electrical connection 56. During the routing process, the LVS tool determines if the added polygons create any errors or expand the size of layout block 34. The LVS tool automatically eliminates the errors and compacts the polygons in layout block 34 so that each layer (e.g., metal, polysilicon or contacts) includes the minimum spacing for a specific manufacturing process. In one embodiment, layout block 34 may be a subcell in a hierarchical design. In this example, the LVS tool may make the appropriate changes in all instances of layout block 34 and may check a top-level structure to determine if the changes caused any errors in the top-level. If the LVS tool identifies any errors in the top-level structure, the LVS tool corrects the errors and verifies that the corrections do not effect any of the subcells.

Figure 5:
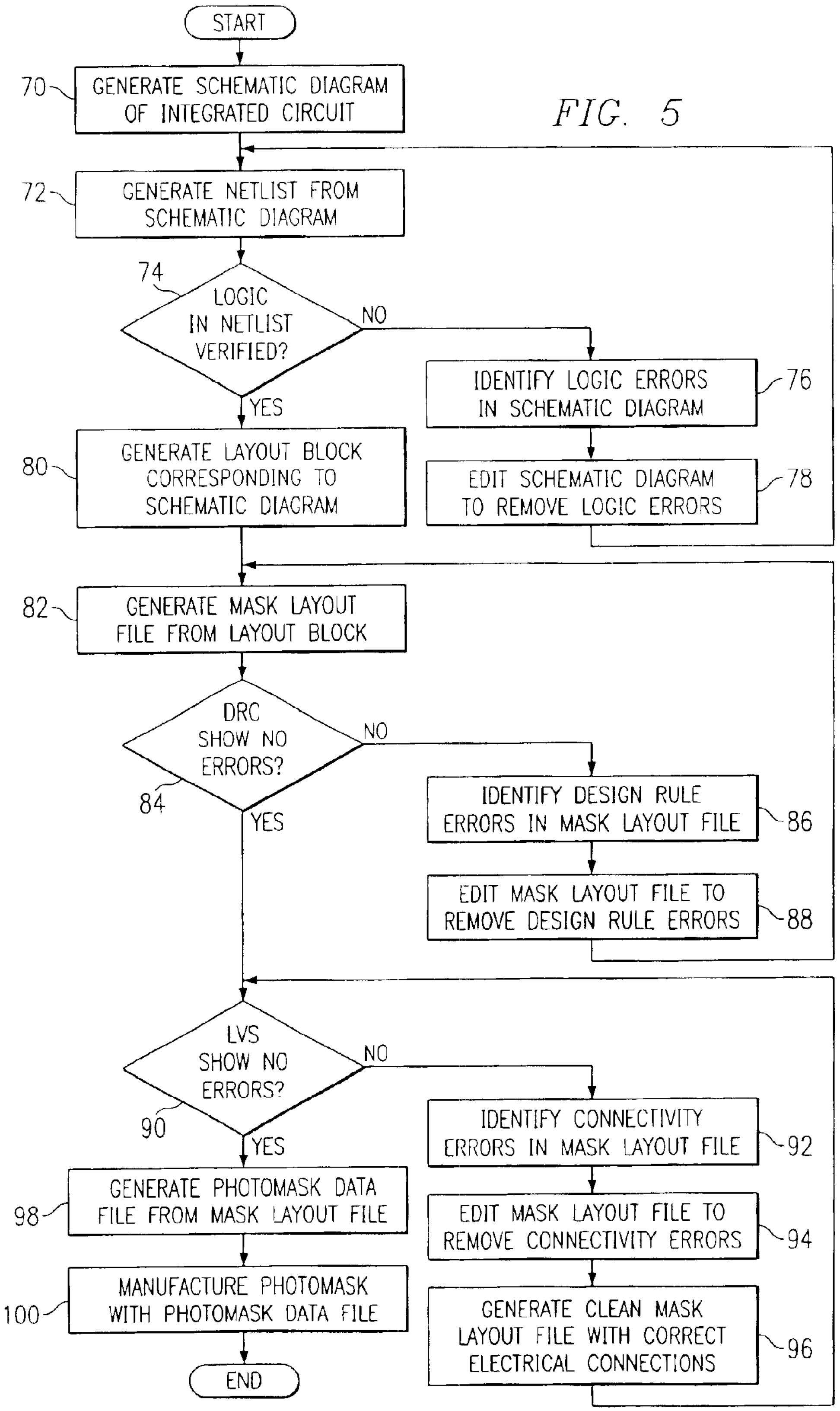
FIG. 5 illustrates a flow chart of a method for correcting connectivity errors in a mask layout file in accordance with the teachings of the present invention.

FIG. 5 illustrates a flow chart of a method for correcting connectivity errors in a mask layout file. Generally, an LVS tool compares a netlist generated from a schematic diagram of an integrated circuit to a mask layout file generated from a corresponding layout block for the integrated circuit. If the mask layout file contains connectivity errors, indicating that electrical connections in the mask layout file do not match corresponding logical connections in the netlist, the LVS tool generates an output file that contains the connectivity errors. The output file may be used by the LVS tool to automatically correct any connectivity errors that were identified. The LVS tool may remove any mismatched electrical connections and add the correct electrical connections in the mask layout file. The LVS tool also eliminates any design rule errors that may be caused by adding polygons associated with the correct electrical connection.

At step 70, a circuit designer creates schematic diagram 20 for an integrated circuit. Schematic diagram 20 may be generated manually by the circuit designer or with a synthesis tool that creates a schematic diagram by using an input file, such as a high level design language (HDL) file. The HDL file may include both behavioral descriptions and structural descriptions for the integrated circuit. Once schematic diagram 20 is complete, a netlist may be generated from schematic diagram 20 at step 72. The netlist may include definitions of the generic cell logic functions and the connections between the various logic functions. In one embodiment, the netlist may be a flat netlist that defines all of the logic and connections at one level. In another embodiment, the netlist may be a hierarchical netlist that contains top-level cells and one or more sub-cells that can be used in any of the top-level cells. The netlist may be generated from CAD tools developed by Cadence, Synopsis or any other company that provides software and/or hardware for generating a netlist from a schematic diagram.

At step 74, the netlist may be tested by a verification tool to determine if schematic diagram 20 includes the correct circuits and logical connections to perform a designated function. If the netlist contains logic errors, the verification tool may generate an output file that contains a list of the logic errors at step 76. The circuit designer may use the output file to correct errors in the logic and/or connections between the logic in schematic diagram 20 at step 78. The corrections may be made manually by the circuit designer or the output file may be used by a synthesis tool to automatically correct the errors and create the correct logical functions and/or connections. Once the corrections have been made, a clean netlist is generated for logic verification at step 72.

If the verification tool determines that the netlist does not contain any logic errors, layout block 34 that represents the integrated circuit shown in schematic diagram 20 is created at step 80. The layout block may be created manually by a layout designer using CAD tools developed by Cadence, Synopsis, Mentor Graphics, or any other company that develops integrated circuit layout tools, or automatically by a synthesis tool. Layout block 34 may include polygons located on different layers that form the transistors and electrical connections for the integrated circuit. The layers in layout block 34 may include, but are not limited to, n-well, p-well, diffusion, polysilicon, up to twelve metal layers and contacts or vias that provide connections between the different layers.

When layout block 34 is complete, a mask layout file is generated at step 82. The mask layout file contains data regarding the geometry and interconnections of the integrated circuit represented in schematic diagram 20. This data may be stored in the GDSII format, CIF format, DFII format, or any other suitable format for data describing the geometry and interconnections of integrated circuits. Like the schematic netlist, the mask layout file may be flat or hierarchical. In a hierarchical design, a top-level structure includes specific references to one or more levels of subcells. The references include all geometry and connectivity information that are included within each of the subcells. Any top level structures and the subcells may also include local geometry and connectivity information that represent circuitry that is logically situated within the top level structure but not included in any referenced subcell.

Once the mask layout file has been generated, a design rule check (DRC) tool determines if there are any design rule errors at step 84. A design rule error may include, but is not limited to, less than minimum spacing between the same or different layers in layout block 34, less than minimum width of the polygons for the various layers and less than minimum size for a contact. If a design rule error is identified, the DRC tool includes the error in an output file at step 86. In one embodiment, the output file may be used by a CAD tool executing on computer system 10 and the errors may be displayed for a layout designer within layout block 34 on display device 16. At step 88, the errors are corrected in the mask layout file by using the output file. In one embodiment, a layout designer may manually correct the design rule errors within layout 34 based on identifying marks provided by a layout editor. In this example, the layout designer may click on an error listed in the output file to load the error into the layout editor. In another embodiment, the DRC tool may automatically correct the design rule errors in the mask layout file by using the output file and a technology file that contains design rules for a specific manufacturing process. Once the design rule errors have been removed from the layout block, a clean mask layout file is generated at step 82.

If the DRC tool determines that the mask layout file does not include any design rule errors, an LVS tool is used to determine if there are any connectivity mismatches between the netlist and the mask layout file at step 90. The LVS tool compares logical connections in the netlist to their corresponding electrical connections in the mask layout file to identify any errors. If the LVS tool determines that connectivity errors are present in the mask layout file, an output file is generated that includes at least one connectivity error at step 92. The output file may be a text file that can be manually read by a layout designer or a data file that may be automatically read by the CAD tool or the LVS tool. In one embodiment, the CAD tool, such as a layout editor, executing on computer system 10 reads the output file and displays the connectivity errors for the layout designer within layout block 34 on display device 16.

At step 94, the LVS tool may automatically remove connectivity errors from the mask layout file. In one embodiment, the LVS tool may remove all polygons associated with a mismatched electrical connection from the mask layout file. In another embodiment, the LVS tool may create a break point in the mismatched connection and remove all polygons associated with the mismatched connection between the break point and the mismatched node. The LVS tool then may locate the correct node in the mask layout file and determine a routing path for the matching electrical connection. The LVS tool routes the matching electrical connection in any appropriate layer (e.g., polysilicon and/or any suitable layer of metal) within the mask layout file. In a further embodiment, the LVS tool may merge the mismatched connection with another electrical connection by adding polygons in the mask layout file between the two connections.

During routing, the LVS tool may move surrounding polygons to add the new polygons associated with the matching electrical connection. Once the matching electrical connection has been completely routed in the mask layout file, the LVS tool checks for design rule errors and automatically corrects any errors. The addition of new polygons may also cause the size of layout block 34 to increase. The LVS tool may reduced the size of layout block 34 by compacting the layout so that the spacing between the polygons on the same or different layers is approximately equal to the minimum spacing allowed for a specific manufacturing process. Since the compaction process uses design rules from a technology file, no design rule errors are introduced into the mask layout file.

In one embodiment, the mask layout file may be a hierarchical design. The hierarchical design may include a top level and one or more sub levels. In order to avoid the need to create the same cell multiple times, a subcell is created and used numerous times throughout the layout. The LVS tool may identify a connectivity error in one of the subcells and correct the error in each instance of the cell. Once the subcells have been corrected, the LVS tool checks the top level to determine if any connectivity mismatches are present and eliminates them. The LVS tool also verifies that the corrections in the subcells did not cause any errors in the top level. In one embodiment, layout block 34 may be a sub cell located in a top-level structure within the hierarchical design.

Once all connectivity errors have been removed from the mask layout file, a clean mask layout file is generated at step 96. The clean mask layout file may be free of connectivity errors and design rule errors, and may include the minimum spacing between polygons for a specific semiconductor manufacturing process. The clean mask layout file is then checked by the LVS tool for any connectivity errors at step 90. In one embodiment, the LVS tool may incrementally check the connectivity in the mask layout files such that the LVS tool only checks the portions of the mask layout file that were changed. If no connectivity errors are found, a photomask data file is generated from the mask layout file at step 98. Multiple photomask data files may be generated to represent the different layers in layout block 34. For example, one photomask data file may contain information for a photomask to be used during the diffusion step of the manufacturing process and another photomask data file may contain information for a photomask to be used to form the polysilicon gates of an integrated circuit. At step 100, each of the photomask data files is used in a lithography tool to create a photomask for each step of a semiconductor manufacturing process.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. An automated method for correcting connectivity errors in a mask layout file, comprising:

comparing a first connection in a mask layout file to a second connection in a schematic netlist;

identifying a connectivity error in the mask layout file if the first connection does not match the second connection; and automatically correcting the connectivity error in the mask layout file by modifying the first connection.

2. The method of claim 1, further comprising:

determining if the modified first connection creates a design rule error; and eliminating the design rule error by further modifying the first connection.

3. The method of claim 1, further comprising generating a clean mask layout file that does not include the connectivity error.

4. The method of claim 1, further comprising generating an output file that includes the connectivity error.

5. The method of claim 1, wherein correcting the connectivity error comprises:

creating a break point in the first connection;

locating a layout node in the mask layout file that corresponds to a schematic node associated with the second connection in the schematic netlist; and routing a third connection from the break point to the layout node.

6. The method of claim 5, further comprising removing a portion of the first connection located between the break point and the layout node.

7. The method of claim 5, further comprising routing the third connection from the break point to the layout node without introducing design rule errors in the mask layout file.

8. The method of claim 1, wherein the mask layout file and the schematic netlist are hierarchical.

9. The method of claim 1, further comprising the schematic netlist including a list of nodes and logical connections associated with a schematic representation of an integrated circuit.

10. The method of claim 1, further comprising the mask layout file including first polygons that represent the first connection and second polygons that represent the second connection.

11. A computer system for correcting connectivity errors in a mask file, comprising:

a processing resource;

a computer readable memory; and processing instructions encoded in the computer readable memory, the processing instructions, when executed by the processing resource, operable to perform operations comprising:

comparing a first connection in a mask layout file to a second connection in a schematic netlist;

identifying a connectivity error in the mask layout file if the first connection does not match the second connection; and automatically correcting the connectivity error in the mask layout file by modifying the first connection.

12. The system of claim 11, further comprising the instructions operable to perform operations including:

creating a break point in the first connection;

locating a layout node in the mask layout file that corresponds to a schematic node associated with the second connection in the schematic netlist; and route a third connection from the break point to the layout node.

13. The system of claim 12, further comprising the instructions operable to perform operations including:

routing a third connection from the break point to the layout node;

determining if the third connection creates a design rule error in the mask layout file; and eliminating the design rule error by modifying the third connection.

14. The system of claim 12, further comprising the instructions operable to perform operations including removing a portion of the first connection located between the break point and the layout node.

15. The system of claim 11, wherein the processing resource is operable to generate a clean mask layout file that does not include the connectivity error.

16. The system of claim 11, wherein the mask layout file and the schematic netlist are hierarchical.

17. Software for correcting connectivity errors in a mask layout file, the software being embodied in computer-readable media and when executed operable to:

compare a first connection in a mask layout file to a second connection in a schematic netlist;

identify a connectivity error in the mask layout file if the first connection does not match the second connection; and in response to identifying the connectivity error, automatically correct the connectivity error in the mask layout file by modifying the first connection.

18. The software of claim 17, further operable to:

determine if the modified first connection creates a design rule error in the mask layout file; and eliminate the design rule error by further modifying the first connection.

19. The software of claim 17, further comprising correcting the connectivity error in the mask layout file by:

creating a break point in the first connection;

locating a layout node in the mask layout file that corresponds to a schematic node associated with the second connection in the schematic netlist; and routing a third connection from the break point to the layout node.

20. The software of claim 19, further comprising correcting the connectivity error in the mask layout file by removing a portion of the first connection located between the break point and the layout node.

21. The software of claim 19, further comprising correcting the connectivity error by routing the third connection from the break point to the layout node without introducing design rule errors in the mask layout file.

22. The software of claim 17, wherein the mask layout file and the schematic netlist are hierarchical.

* * * * *